(12) United States Patent
Masonobu et al.

(10) Patent No.: US 7,265,066 B2
(45) Date of Patent: Sep. 4, 2007

(54) METHOD AND SYSTEM FOR INCREASING TENSILE STRESS IN A THIN FILM USING COLLIMATED ELECTROMAGNETIC RADIATION

(75) Inventors: Igeta Masonobu, Fishkill, NY (US); Cory Waida, Sand Lake, NY (US); Gert Leusink, Saltpoint, NY (US)

(73) Assignee: Tokyo Electron, Ltd., Tokyo (JP)

( * ) Notice: Subject to any disclaimer, the term of this patent is extended or adjusted under 35 U.S.C. 154(b) by 0 days.

(21) Appl. No.: 11/091,756

(22) Filed: Mar. 29, 2005

(65) Prior Publication Data

US 2006/0226519 A1   Oct. 12, 2006

(51) Int. Cl.
*H01L 21/00* (2006.01)
(52) U.S. Cl. .................. 438/795; 257/649; 438/792
(58) Field of Classification Search ............. 438/795
See application file for complete search history.

(56) References Cited

U.S. PATENT DOCUMENTS

| 6,429,135 | B1 | 8/2002 | Chern et al. ............... 438/692 |
| 2001/0014512 | A1* | 8/2001 | Lyons et al. ............... 438/424 |
| 2004/0004708 | A1 | 1/2004 | Willis |
| 2004/0063290 | A1* | 4/2004 | Jennings et al. ............ 438/308 |
| 2005/0217799 | A1 | 10/2005 | O'Meara et al. |

OTHER PUBLICATIONS

Akazawa, "Radiation effects in vaccuum-ultraviolet-irradiated SiNx:H films," Nuclear Instruments and Methods in Physics Research B, 116 (1996), pp. 355-359.*
Goto, et al., Technology Booster using Strain-Enhancing Laminated SiN (SELS) for 65nm Node HP MPUs, IEEE International Electron Devices Meeting, San Francisco, CA, Dec. 13-15, 2004.
www.timedomaincvd.com, TimeDomain CVD, Inc., "Plasma-enhanced CVD of Silicon Nitride", pp. 1-2, 2005.
Nowling, et al., "Remote plasma-enhanced chemical vapour deposition of silicon nitride at atmospheric pressure", Plasma Sources Sci. Technol. 11 (2002), pp. 97-103, Feb. 4, 2002.

* cited by examiner

*Primary Examiner*—Carl Whitehead, Jr.
*Assistant Examiner*—Colleen E. Rodgers
(74) *Attorney, Agent, or Firm*—DLA Piper US LLP

(57) ABSTRACT

A method and system are described for increasing the tensile stress in thin films formed on a substrate, such as silicon nitride films. The thin film may be a planar film, or a non-planar film, such as a nitride film formed over a NMOS gate. The thin film is exposed to collimated electro-magnetic (EM) radiation to anisotropically expose the film. The EM radiation can have a component having a wavelength less than about 500 nm. The EM source can include a multi-frequency source of radiation.

31 Claims, 4 Drawing Sheets

METHOD AND SYSTEM FOR INCREASING TENSILE STRESS IN A THIN FILM USING COLLIMATED ELECTROMAGNETIC RADIATION

FIELD OF THE INVENTION

The present invention relates to semiconductor processing, and more particularly to a method and system for increasing tensile stress in a thin film.

BACKGROUND OF THE INVENTION

Silicon nitride (SiN) films are widely used in semiconductor devices and ultra-large-scale integrated circuits. For example, SiN films have been widely used in semiconductor devices as a diffusion barrier for dopants, as an etch-stop film during etching of fine features, as a final passivation film for encapsulation of fabricated devices, among many other uses.

SiN films can be deposited at low pressure or at atmospheric pressure using a variety of processing systems and process gases. These processing systems can perform, for example, thermal chemical vapor deposition (TCVD), plasma-enhanced chemical vapor deposition (PECVD), or remote-PECVD, where in remote-PECVD the substrate to be processed is not placed in direct contact with the plasma but is placed down-stream of the plasma discharge, among others. Device quality SiN films have been deposited, for example, by PECVD using silane ($SiH_4$) and ammonia ($NH_3$) or nitrogen ($N_2$) or thermal CVD using dichlorosilane ($SiH_2Cl_2$) and $NH_3$.

Deposited SiN films are often under stress. The stress can be either compressive or tensile, and can vary depending on the deposition process, gas mixture, deposition rate, substrate temperature, hydrogen content of the SiN film, ion bombardment or other process parameters. Tensile stress greater than about 1 GPa has been observed for SiN films. In PECVD deposition, ion bombardment of the SiN film can be used to density films and induce more compressive stress. High tensile stress of a SiN passivation film can result in high stress between the SiN passivation film and the underlying substrate. In one example, capping a negative metal oxide semiconductor (NMOS) device containing a gate stack with a high tensile stress SiN film has been shown to induce tensile channel strain in the NMOS structure, thereby increasing electron mobility and the speed of the device. It has been observed that the amount of bonded hydrogen in SiN films decreases during electron bombardment and/or annealing in proportion with tensile stress increase.

SUMMARY OF THE INVENTION

A method and system are provided for forming high tensile stress SiN films.

The method for increasing tensile stress of a nitride film includes providing a substrate comprising a SiN film containing hydrogen formed on the substrate, and exposing the SiN film to collimated electromagnetic radiation to anisotropically reduce the hydrogen content and increase the tensile stress of the SiN film.

The processing system includes a processing chamber, a substrate holder disposed in the chamber, and an electromagnetic radiation source producing collimated electromagnetic radiation in the chamber to anisotropically irradiate a substrate on the substrate holder.

The semiconductor device includes a substrate and a SiN film disposed on the substrate. The SiN film as disposed contains hydrogen. It is then exposed to collimated electromagnetic radiation to anisotropically reduce the hydrogen content and increase the tensile stress of the SiN film.

DETAILED DESCRIPTION OF SEVERAL EMBODIMENTS OF THE INVENTION

In the following description, in order to facilitate a thorough understanding of the invention and for purposes of explanation and not limitation, specific details are set forth, such as a particular geometry of plasma processing system and descriptions of various components. However, it should be understood that the invention may be practiced in other embodiments that depart from these specific details.

Figure 1:
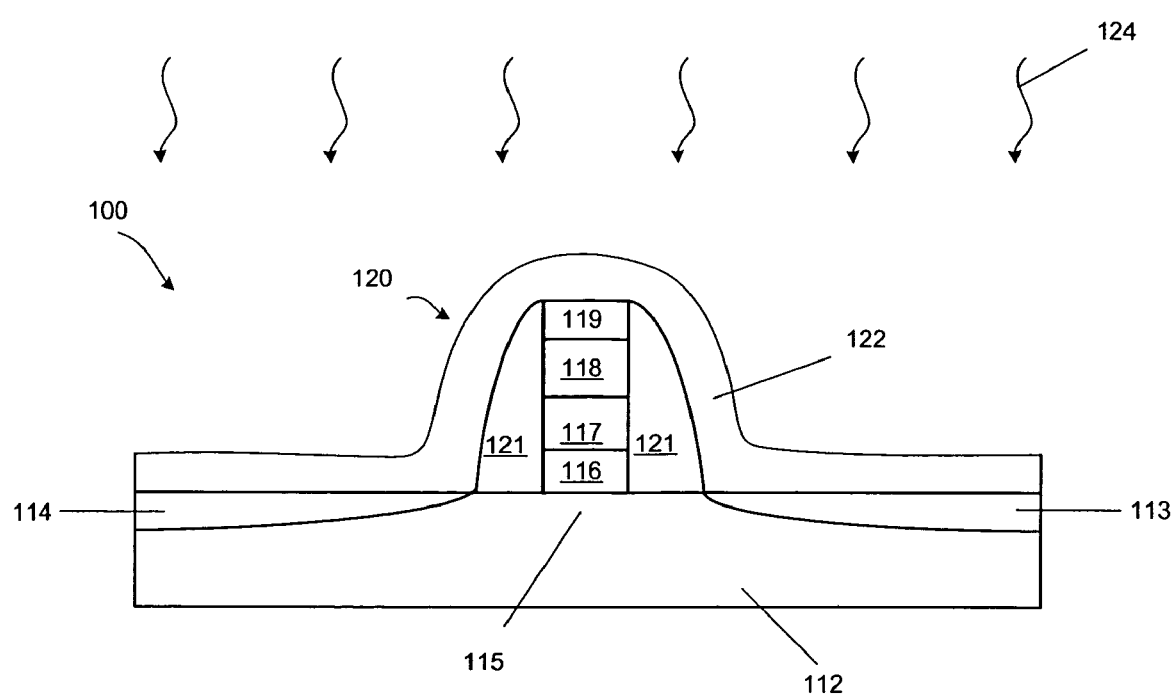
FIG. 1 schematically shows a cross-sectional view of a MOS device containing a high tensile stress SiN film according to an embodiment of the invention.

Referring now to the drawings, FIG. 1 schematically shows of a cross-sectional view of a MOS device containing a SiN film according to an embodiment of the invention. The device 100 contains a substrate 112 having doped regions 113 and 114 (e.g., source and drain), a gate stack 120, a spacer 121, and a SiN passivation film 122. The substrate 112 can, for example, contain Si, Ge, Si/Ge, or GaAs. The substrate (wafer) 112 can be of any size, for example, a 200 mm substrate, a 300 mm substrate, or an even larger substrate.

The gate stack 120 contains a dielectric layer 116 over the channel region 115. The dielectric layer 116 can, for example, contain an oxide layer (e.g., $SiO_2$), a nitride layer (e.g., $SiN_x$), or an oxynitride layer (e.g., $SiO_xN_y$), or a combination thereof or any other appropriate material. The dielectric layer 116 can further contain a high-dielectric constant (high-k) dielectric material. The high-k dielectric material can, for example, contain metal oxides and their silicates, including $Ta_2O_5$, $TiO_2$, $ZrO_2$, $Al_2O_3$, $Y_2O_3$, $HfSiO_x$, $HfO_2$, $ZrO_2$, $ZrSiOx$, $TaSiO_x$, $SrO_x$, $SrSiO_x$, $LaO_x$, $LaSiO_x$, $YO_x$, or $YSiO_x$, or combinations of two or more thereof. A conductive layer 117 is formed on the dielectric layer 116 and a silicide layer 118 is formed on the conductive layer 117 to reduce the electrical resistance of the conductive layer 117. The cap layer 119 is positioned on top of the gate stack 120 to protect the gate 120. The cap layer 119 can, for example, be SiN.

In one example, the conductive layer 117 can be doped polysilicon, and the silicide layer 118 can be tungsten silicide. As those skilled in the art will appreciate, the gate stack 120 may be composed of different and fewer or more layers than are shown in FIG. 1. In one example, layer 117 and/or 118 may be replaced by a metal gate layer.

FIG. 1 further shows the spacer 121 formed on either side of the gate 120 in order to protect the gate 120 from damage and ensure electrical performance of the gate. In addition, the spacer 121 can be used as a hard mask for the formation of the source and drain 112, 113 of the MOS device 100. Alternately, more than one spacer 121 may be used. The device 100 further contains a SiN passivation film 122 deposited onto the substrate 112. As those skilled in the art will appreciate, the SiN films can have various Si/N ratios. According to an embodiment of the invention, the deposited SiN passivation film 122 has a high hydrogen content. In one example, the hydrogen content can be between about 10 atomic percent and about 50 atomic percent. In another example, the hydrogen content can be between about 20 atomic percent and about 40 atomic percent. The deposited SiN passivation film 122 can have high tensile stress, for example about 1 GPa, or higher. Such films can be formed employing Low-Pressure Chemical Vapor Deposition (LPCVD). See U.S. Pat. No. 6,429,135, the contents of which are incorporated herein by reference. Alternatively, such films can be formed employing atmospheric pressure remote-PECVD using a process gas including nitrogen, helium and silane at a substrate temperature of around 100° to 500° C. See "Remote Plasma-Enhanced Chemical Vapour Deposition of Silicon Nitride At Atmospheric Pressure," G. R. Nowling et al., Plasma Sources Sci. Technol. 11 (2002) 97-103 and "Plasma-Enhanced CVD of Silicon Nitride" at http://www.timedomaincvd.com/CVD_Fundamentals/films/SiN_plasma_CVD.html.

Embodiments of the invention provide a method for reducing the hydrogen content and increasing the tensile stress of the SiN passivation film 122. The increased tensile stress can induce tensile strain in the channel of a MOS structure (e.g., channel 115 in FIG. 1), thereby increasing electron mobility and the speed of the device 100.

In FIG. 1, the MOS device 100 is exposed to electromagnetic radiation 124 to reduce the hydrogen content and increase the tensile stress of the SiN passivation film 122. Electromagnetic radiation includes radiant energy in the form of photons, including, in the order of decreasing energy, gamma radiation, X-rays, ultraviolet radiation (UV), visible light, infrared energy, microwave radiation, and radio waves. According to an embodiment of the invention, exposure of the device 100 to the electromagnetic radiation 124 reduces the hydrogen content of the SiN film 122, thereby increasing the tensile stress of the SiN film 122. According to an embodiment of the invention, the exposure can be combined with annealing of the device 100, i.e., the annealing can be performed before, during, and/or after the exposure.

According to one embodiment of the invention, the electromagnetic radiation 124 can be multi-frequency electromagnetic radiation with frequencies corresponding to wavelengths less than about 500 nm. According to another embodiment of the invention, the electromagnetic radiation can include wavelengths between about 500 nm and about 125 nm. Alternatively, the electromagnetic radiation can include wavelengths in the ultraviolet range.

Alternatively, a single frequency electromagnetic radiation source may be employed. Examples of radiation sources that can be employed to generate the single frequency electromagnetic radiation, or components of the multi-frequency electromagnetic radiation, include Xe (172 nm), KrCl (222 nm), KrF (248 nm), $F_2$ (157 nm), ArF (193 nm), KrF (248 nm), XeCl (308 nm) or XeF (351 nm) excimer lamps.

Figure 4:
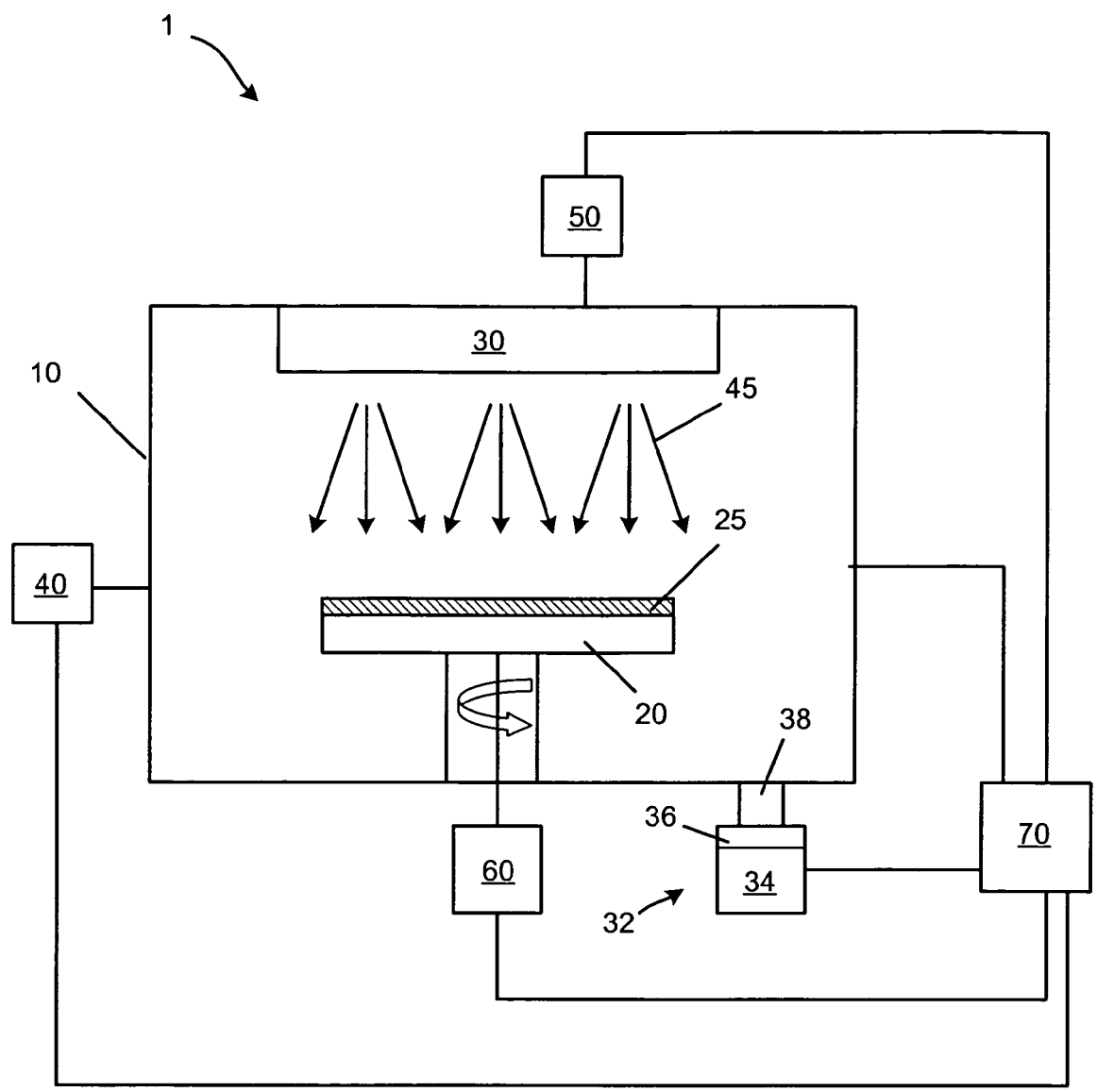
FIG. 4 is a schematic diagram of a processing system according to an embodiment of the invention.

According to one embodiment of the invention, the electromagnetic radiation 124 can be diffuse radiation that is nearly isotropic (i.e., not strongly directional). Exposure of the device 100 to diffuse radiation reduces the hydrogen content of the SiN film 122 substantially isotropically, thereby non-selectively increasing the tensile stress of the horizontal and vertical areas of the SiN film 122. A processing system configured for exposing a substrate to diffuse radiation is depicted in FIG. 4 (discussed in more detail below).

In one example, a blanket SiN film containing hydrogen on an unpatterned substrate was exposed to diffuse electromagnetic radiation of 50 mW/cm$^2$ with a wavelength of 172 nm. The tensile stress of the SiN film increased from about 1.2 GPa to about 1.6 GPa upon exposure to the electromagnetic radiation.

Figure 5:
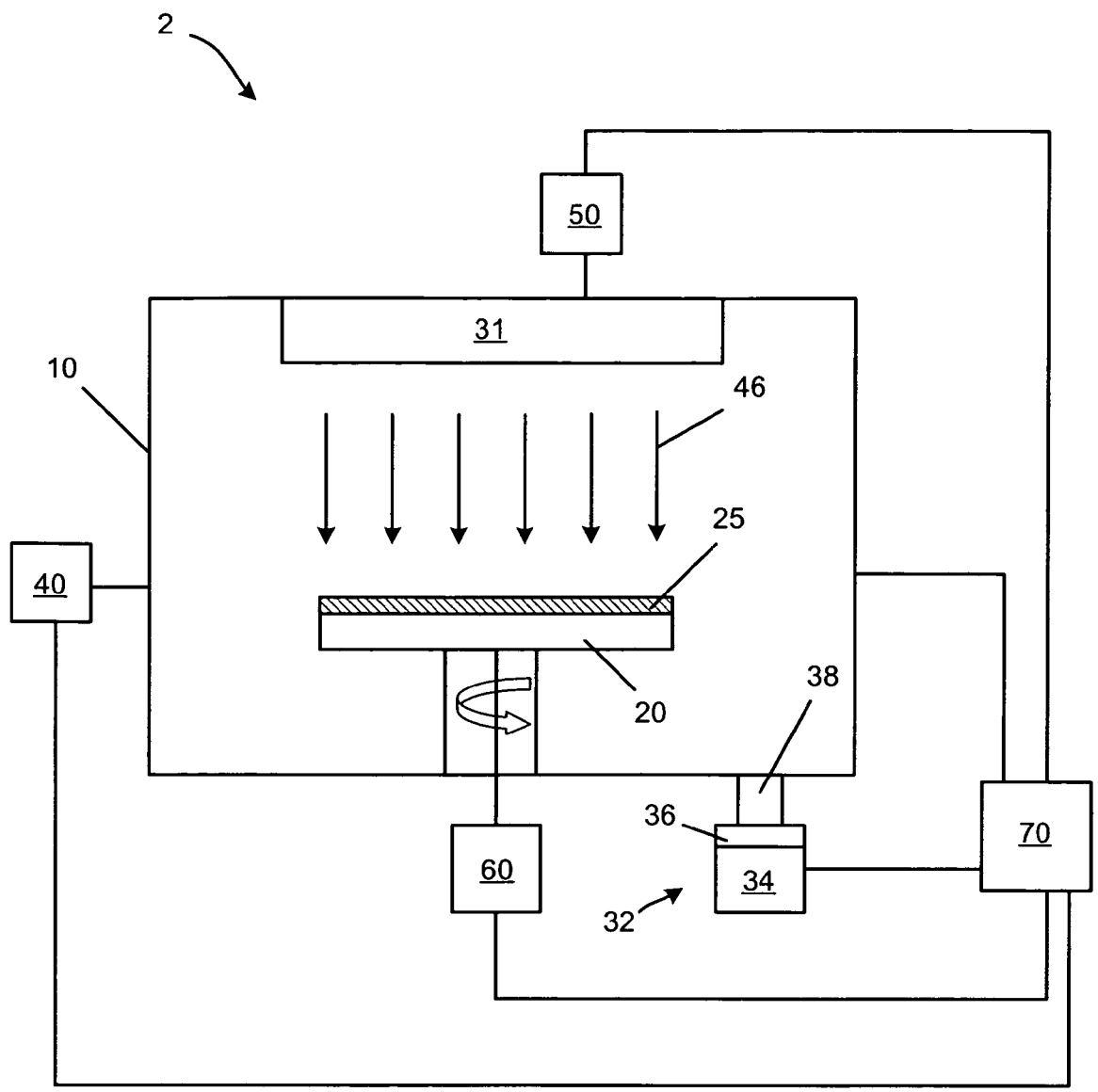
FIG. 5 is a schematic diagram of a processing system according to another embodiment of the invention.

According to one embodiment of the invention, the electromagnetic radiation 124 can be collimated radiation, i.e., radiation in which all electromagnetic rays from the radiation source are substantially parallel to each other. Exposure of the device 100 to radiation collimated in the vertical direction reduces the hydrogen content of the SiN film 122 substantially non-isotropically, thereby selectively increasing the tensile stress of the horizontal areas of the SiN film 122 compared to the vertical areas of the SiN film 122. A processing system configured for exposing a substrate to collimated radiation is depicted in FIG. 5 (discussed in more detail below).

Figure 2:
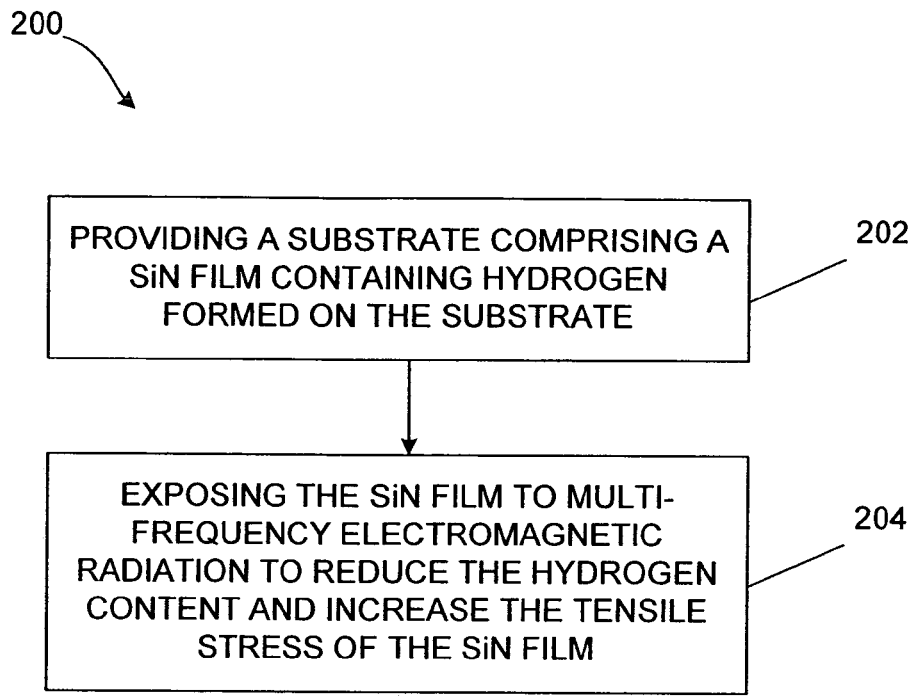
FIG. 2 is a flow diagram for exposing a substrate to electromagnetic radiation according to an embodiment of the invention.

FIG. 2 is a flow diagram for exposing a substrate to multi-frequency electromagnetic radiation according to an embodiment of the invention. The process 200 includes, at 202, providing a substrate comprising a SiN film containing hydrogen formed on the substrate. At 204, the SiN film is exposed to multi-frequency electromagnetic radiation to reduce the hydrogen content and increase the tensile stress of the SiN film. The exposure can be performed under predetermined processing conditions for a time period that results in a desired removal of hydrogen and the desired tensile stress of the SiN film. A process recipe for removal of the hydrogen can be determined by direct experimentation and/or design of experiments (DOE). After processing the substrate according to embodiments of the invention, the hydrogen content and/or the tensile stress of the SiN film can be measured.

Figure 3:
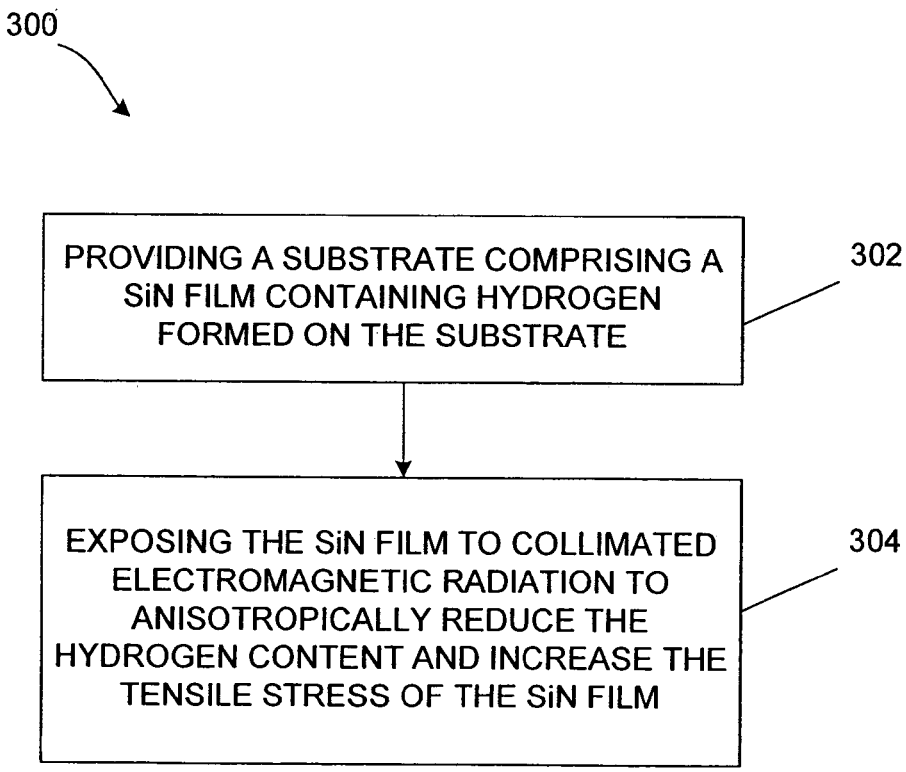
FIG. 3 is a flow diagram for exposing a substrate to collimated electromagnetic radiation according to another embodiment of the invention.

FIG. 3 is a flow diagram for processing a gate stack according to an embodiment of the invention. The process 300 includes, at 302, providing a substrate comprising a SiN film containing hydrogen formed on the substrate. At 304, the SiN film is exposed to collimated electromagnetic radiation to anisotropically reduce the hydrogen content and increase the tensile stress of the SiN film. The exposure can be performed under predetermined processing conditions for a time period that results in a desired anisotropic removal of hydrogen and desired tensile stress of the SiN film. A process recipe for removal of the hydrogen can be determined by direct experimentation and/or design of experiments (DOE). After processing the substrate according to embodiments of the invention, the hydrogen content and/or the tensile stress of the SiN film can be measured.

The processes 200 and 300 described in FIGS. 2 and 3 may further contain an annealing step for annealing the substrate before, during, and/or following the exposure of the SiN film to the electromagnetic radiation. The annealing step can, for example, be performed to further reduce the hydrogen content of the SiN film. The annealing temperature can, for example, be between about 200° C. and about 1000°

C. Alternately the annealing temperature can be between about 400° C. and about 700° C.

As would be appreciated by those skilled in the art, each of the steps or stages in the flowchart of FIGS. 2 and 3 may encompass one or more separate operations. Accordingly, the recitation of only two operations at 202, 204 or 302, 304 should not be understood to limit the method of the present invention solely to two operations. Moreover, each representative operation 202, 204 or 302, 304 should not be understood to be limited to only a single process. Of course, process 200 may be employed on a gate stack structure or any other structure, just as process 300 can be employed on any substrate or structure.

Stages 202 and 204 or stages 302 and 304 can be repeated as many times as desired to develop a SiN film of any thickness. For example, stages 202 and 204 or stages 302 or 304 may be employed to provide a SiN film having a thickness of about 10 Angstroms to about 50 Angstroms. Stages 202 and 204 or stages 302 and 304 can then be repeated to deposit a second SiN film having a thickness of about 10 Angstroms to about 50 Angstroms. By repeating stages 202 and 204 or stages 302 and 304, a SiN film can be built to any desired thickness, e.g., about 100 Angstroms to about 1 micron.

FIG. 4 is a schematic diagram of a processing system according to an embodiment of the invention. The processing system 1 contains a process chamber 10 having a substrate holder 20 configured to support a substrate 25 containing a SiN film. The process chamber 10 further contains an electromagnetic radiation assembly 30 for exposing the substrate 25 to electromagnetic radiation. Additionally, the processing system 1 contains a power source 50 coupled to the electromagnetic radiation assembly 30, and a substrate temperature control system 60 coupled to substrate holder 20 and configured to control the temperature of substrate 25. A gas supply system 40 is coupled to the process chamber 10 and configured to introduce a process gas to process chamber 10. The process gas can comprise an inert gas, such nitrogen or a noble gas (i.e., helium, neon, argon, xenon, krypton). Alternatively, no process gas may be employed.

The electromagnetic radiation assembly 30 in FIG. 4 is configured to expose the substrate 25 to diffuse radiation 45 that is nearly isotropic (i.e., not strongly directional). In other words, the diffuse radiation 45 is not predominantly incident to the substrate 25 from any particular direction. Electromagnetic radiation assemblies capable of producing diffuse radiation are well known to those skilled in the art. For example, the electromagnetic radiation assembly 30 can be capable of generating an output between about 10 mW/cm$^2$ and about 1000 mW/cm$^2$. According to another embodiment of the invention, the output can be between about 50 mW/cm$^2$ and about 500 mW/cm$^2$. According to an embodiment of the invention, the wavelength of the electromagnetic radiation 45 can be below about 500 nm. According to another embodiment of the invention, the wavelength can be between about 500 nm and about 125 nm.

Referring still to FIG. 4, the processing system 1 may be configured to process 200 mm substrates, 300 mm substrates, or larger-sized substrates. In fact, it is contemplated that the processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

Temperature control system 60 comprises temperature control elements, such as a recirculating coolant system that, when cooling, receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be provided in the substrate holder 20, as well as the chamber wall of the process chamber 10 and any other component within the processing system 1.

In order to improve the thermal transfer between substrate 25 and substrate holder 20, the substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 can be further coupled to a pressure control system 32, including, for example, a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials.

The vacuum pumping system 34 can include a turbo-molecular vacuum pump (TMP) capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Additionally, the processing system 1 contains a controller 70 coupled to the process chamber 10, substrate holder 20, electromagnetic radiation assembly 30, power source 50, and substrate temperature control system 60. Alternately, or in addition, controller 70 can be coupled to a one or more additional controllers/computers (not shown), and controller 70 can obtain setup and/or configuration information from an additional controller/computer.

In FIG. 4, singular processing elements (10, 20, 30, 50, 60, and 70) are shown, but this is not required for the invention. The processing system 1 can comprise any number of processing elements having any number of controllers associated with them in addition to independent processing elements.

The controller 70 can be used to configure any number of processing elements (10, 20, 30, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Controller 70 can comprise a microprocessor, memory, and a digital I/O port capable of generating control voltages sufficient to communicate and activate inputs to processing system 1 as well as monitor outputs from processing system 1. For example, a program stored in the memory may be utilized to activate the inputs to the aforementioned components of the processing system 1 according to a process recipe in order to perform process. One example of the controller 70 is a DELL PRECISION WORKSTATION 610™, available from Dell Corporation, Austin, Tex.

The controller 70 may be locally located relative to the processing system 1, or it may be remotely located relative to the processing system 1. For example, the controller 70 may exchange data with the deposition 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 60 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

The processing conditions can further include a substrate temperature between about 0° C. and about 1000° C. Alternately, the substrate temperature can be between about 200° C. and about 1000° C., or between about 400° C. and about 700° C. The pressure in the process chamber 10 can, for example, be maintained between about $10^{-5}$ Torr or even lower and about 3000 mTorr. Alternately, the pressure can be maintained between about 20 mTorr and about 1000 mTorr. Yet alternately, the pressure can be maintained between about 50 mTorr and about 500 mTorr. At very low pressure, e.g., about $10^{-5}$ Torr or even lower, the process can employ a process gas. Alternatively, a process gas is not necessary.

FIG. 5 is a schematic diagram of a processing system according to an embodiment of the invention. The processing system 2 depicted in FIG. 5 is similar to the processing system 1 depicted in FIG. 4 but contains an electromagnetic radiation assembly 31 configured to form and expose the substrate 25 to collimated radiation 46 having electromagnetic rays that are substantially parallel to each other. Electromagnetic radiation assemblies capable of producing collimated radiation are well known to those skilled in the art. For example, the collimated radiation 46 can be formed by collimating diffuse radiation from one or more radiation sources housed in the electromagnetic radiation assembly 31 using a condenser lens, or other devices such as one or more baffles. For example, the electromagnetic radiation assembly 31 can be capable of generating an output between about 10 mW/cm² and about 1000 mW/cm². According to another embodiment of the invention, the output can be between about 50 mW/cm² and about 500 mW/cm². According to an embodiment of the invention, the wavelength of the electromagnetic radiation 45 can be below about 500 nm. According to another embodiment of the invention, the wavelength can be between about 275 nm and about 125 nm.

It should be understood that various modifications and variations of the present invention may be employed in practicing the invention. It is therefore to be understood that, within the scope of the appended claims, the invention may be practiced otherwise than as specifically described herein.

What is claimed is:

1. A method of increasing tensile stress of a nitride film, the method comprising:
    providing a substrate comprising a SiN film containing hydrogen formed on the substrate; and
    exposing the SiN film to collimated electromagnetic radiation to increase the tensile stress of the SiN film.

2. The method according to claim 1, wherein the electromagnetic radiation is multi-frequency electromagnetic radiation including a component having a wavelength below about 500 nm.

3. The method according to claim 1, wherein the electromagnetic radiation includes a component having a wavelength between about 125 mn and about 500 nm.

4. The method according to claim 1, wherein the electromagnetic radiation includes a wavelength of 157 nm, 172 nm, 193 nm, 222 nm, 248 nm, 308 nm, or 351 nm, or a combination of two or more thereof.

5. The method aceording to claim 1, wherein the electromagnetic radiation intensity in between about 10 mW/cm² and about 1000 mW/cm².

6. The method according to claim 1, wherein the electromagnetic radiation intensiiy is between about 50 mW/cm² and about 500 mW/cm².

7. The method according to claim 1, wherein the providing comprises providing a SiN film having tensile stress between about 1 GPa and about 1.5 GPa.

8. The method, according to claim 7, wherein the exposing comprises forming a SiN film having tensile stress greater than about 1.5 GPa.

9. The method according to claim 7, wherein the exposing comprises forming a SiN film having tensile stress between about 1.5 GPa and about 3 GPa.

10. The method acconiing to claim 1, wherein the electromagnetic radiation is collimated in a direction perpendicular to a surface of the substrate.

11. The method according to claim 1, wherein the substrate further comprises a device containing at least one doped region and a gate stack formed on the substrate.

12. The method according to claim 11, wherein the electromagnetic radiation is collimated in a direction perpendicular to a surface of the substrate.

13. The method according to claim 1, further comprising:
    annealing the SiN film prior to, during, or following the exposing, or a combination of two or more thereof.

14. The method according to ciaim 1, wherein the providing comprises providing a SiN film containing between about 10 atomic percent and about 50 atomic percent hydrogen.

15. The method according to claim 1, wherein the providing comprises providing a SiN film containing between about 20 atomic percent and about 40 atomic percent hydrogen.

16. The method according to claim 1, wherein the substrate, is maintained within a temperature range of about 200° C. and about 1000° C.

17. The method according to claim 1, wherein the substrate is maintained within a temperature range of about 400° C. and about 700° C.

18. The method according to claim 1, further comprising repeating the providing and the exposing until the SiN film has a predetermined thickness.

19. The method according to claim 18, wherein the thickness of the SiN film, after the repeating, has a thickness of between about 100 Angstroms and about 1 micron.

20. The method according to claim 1, wherein the exposing is performed at a pressure of between about $10^{-5}$ Torr and 3000 mTorr.

21. The method of claim 1, wherein the exposing further comprises exposing the SiN film to collimated electromagnetic radiation to anisotropically reduce the hydrogen content in the SiN film.

22. A semiconductor device, comprising:
a substrate;
a SiN film disposed on the substrate, the SiN film formed by providing a SiN film containing hydrogen on the substrate and exposing the provided SiN film to collimated electromagnetic radiation to increase the tensile stress of the SiN film.

23. The semiconductor device according to claim 22, wherein the SiN film, prior to the exposing, has a tensile stress between about 1 GPa and about 1.5 GPa.

24. The semiconductor device according to claim 23, wherein the SiN film, after the exposing, has a tensile stress greater than about 1.5 GPa.

25. The semiconductor device according to claim 23, wherein the SiN film, after the exposing, has a tensile stress between about 1.5 GPa and about 3 GPa.

26. The semiconductor device according to claim 22, wherein the substrate further comprises a device containing at least one doped region and a gate stack formed on the substrate.

27. The semiconductor device according to claim 22, wherein the electromagnetic radiation is collimated in a direction perpendicular to a surface of the substrate.

28. The semiconductor device according to claim 22, wherein the SiN film, prior to the exposing, contains between about 10 atomic percent and about 50 atomic percent hydrogen.

29. The semiconductor device according to claim 22, wherein the SiN film, prior to the exposing, contains between about 20 atomic percent and about 40 atomic percent hydrogen.

30. The semiconductor device according to claim 22, wherein the thickness of the SiN film is between about 100 Angstroms and about 1 micron.

31. The semiconductor device of claim 22, wherein the provided SiN film is exposed to collimated electromagnetic radiation to anisotropically reduce the hydrogen content in the SiN film.

* * * * *